(12) United States Patent
Simon et al.

(10) Patent No.: US 6,369,666 B1
(45) Date of Patent: Apr. 9, 2002

(54) MODULATOR CIRCUIT CONFIGURATION

(75) Inventors: Martin Simon, Otterfing; Werner Veit, Unterhaching, both of (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/718,895

(22) Filed: Nov. 22, 2000

(30) Foreign Application Priority Data

Nov. 22, 1999 (DE) .......................... 199 56 073

(51) Int. Cl.[7] .......................... H03C 3/00; H04L 27/12; H04L 27/20; H04L 27/32

(52) U.S. Cl. .................. 332/100; 375/302; 375/305; 375/308

(58) Field of Search ............... 332/100–102; 375/302–308

(56) References Cited

U.S. PATENT DOCUMENTS 5,946,634 A * 8/1999 Korpela .................. 455/552
6,246,286 B1 * 6/2001 Persson .................. 330/149

FOREIGN PATENT DOCUMENTS

GB 2348755 * 10/2000

OTHER PUBLICATIONS

Taizo Yamawaki et al.: "A 2.7–V GSM RF Transceiver IC", IEEE Journal of Solid–State Circuits, vol. 32, No. 12, Dec. 1997, pp. 2089–2096.
G. Irvine et al.: "An Up–Conversion Transmitter IC for Digital Mobile Telephones", 1998 IEEE International Solid–State Circuits Conference, pp. 364–365.
Dirk Kammeyer: "Nachrichtenübertragung" [data transmission], B. G. Teubner Verlag, Stuttgart, Germany, pp. 370–376; 1992.

* cited by examiner

Primary Examiner—David Mis
(74) Attorney, Agent, or Firm—Herbert L. Lerner; Laurence A. Greenberg; Werner H. Stemer

(57) ABSTRACT

The circuit for combined operation of a mobile radio with GMSK and 8-PSK modulation includes a transmission PLL for GMSK operation, and a direct modulator for 8-PSK operation. A transmission oscillator in the transmission PLL is also used as a synthesizer oscillator for the direct modulator. The modulation in the transmission PLL is suppressed for this purpose. The circuit allows cost-effective implementation while retaining the advantages of a transmission PLL.

9 Claims, 2 Drawing Sheets

MODULATOR CIRCUIT CONFIGURATION

BACKGROUND OF THE INVENTION

FIELD OF THE INVENTION

The invention relates to a circuit configuration for modulation with a transmission PLL. Such modulators are particularly suitable for GMSK modulation in mobile radios.

In mobile radios operating in the GSM Standard, data are transmitted using GMSK (Gaussian minimum shift keying) modulation. At the moment, the same type of modulation is used both for voice transmission and for data transmission. However, the data rate is not sufficient for multimedia applications going beyond a pure voice service, so that a more recent standard proposes 8-PSK modulation. 8-PSK modulation allows three times as much data to be transmitted per unit time. The GMSK symbols have a constant envelope curve, that is to say a constant amplitude, while the 8-PSK symbols have a non-constant envelope curve, and have a different amplitude. According to the specification in the Standard, it is possible to switch directly between GMSK modulation and 8-PSK modulation from one time slot to the next. The combined transmission system is called GSM Edge.

A transmission PLL (PLL: Phase Locked Loop) or Up-conversion Loop is used for GMSK modulation. The literature reference G. Irvine et al.: "An Up-conversion Loop Transmitter IC for Digital Mobile Telephones", 1998 IEEE International Solid-State Circuits Conference, pages 364–65, describes a transmission PLL. A voltage-controlled oscillator (VCO) is actuated by the phase information and produces the modulated output signal for transmission via the antenna, after appropriate amplification. The VCO output is fed back via a down-conversion mixer, to which the output signal from a channel oscillator is supplied, and via a quadrature component modulator to a phase detector in the phase locked loop. The downward-modulated signal is compared with a reference frequency in the phase detector. The output signal from the phase detector is passed via a loop filter in order to produce the frequency control signal for the VCO. In Irvine et al., the quadrature component modulator is actuated by the downward-mixed output signal. The literature reference Yamawaki et al.: "A 2.7-V GSM RF Transceiver IC", IEEE Journal of Solid-State Circuits, Volume 32, No. 12, December 1997, page 2089–96 describes a transmission PLL in which the output of the down-conversion mixer is fed back without being modulated to one input of the phase detector, and the other input of the phase detector is fed from an oscillator, onto which the quadrature components of the wanted signal are modulated. The quadrature component modulator is located upstream of the phase discriminator, either in the feedback loop of the transmission PLL (Irvine et al.) or in the reference signal phase (Yamawaki et al.).

The loop filter of the transmission PLL is a low-pass filter. At radio frequencies it acts as a narrowband bandpass filter within the transmission PLL, in order to allow the wanted signal to pass. The VCO is of low-noise design. This solution has been adopted in particular because there is no need for any duplex filter downstream of the transmission amplifier and immediately upstream of the antenna. The duplex filter ensures that the transmission signal is attenuated outside the transmission band, and prevents noise and nearby transmissions from being injected into the reception channel. It is relatively expensive and necessitates increased power consumption in the transmission amplifier.

Owing to these advantages, it is desirable to continue to use the concept of the transmission PLL in appliances based on the combined GMSK/8-PSK Standard as well. Since the amplitude of the output signal from the VCO is constant in GMSK modulation, but, in contrast, 8-PSK modulation has a variable-amplitude envelope, it is not possible to use a transmission PLL for 8-PSK modulation without some further action.

SUMMARY OF THE INVENTION

The object of the invention is to provide a modulator circuit assembly which overcomes the above-noted deficiencies and disadvantages of the prior art devices and methods of this kind, and which is suitable for two modulation types, in particular GMSK and 8-PSK modulation.

With the above and other objects in view there is provided, in accordance with the invention, a modulator circuit configuration, comprising:

a first modulator having
    a controllable-frequency oscillator with an output for a first output signal;
    a down-conversion mixer connected to the output;
    a phase detector having a first input and a second input receiving the first output signal of the oscillator fed back via the down-conversion mixer; and
    a mixer device configured to produce a signal modulated with a wanted signal;

a second modulator having
    an input connected to the output of the oscillator; and
    a mixer device configured to produce a signal, modulated with the wanted signal, as a second output signal;

a first switching device connected to the first and second modulators for switching between the first output signal and the second output signal; and a second switching device connected to and feeding an unmodulated signal to the first input of the phase detector when the first switching device is switched to the second output signal, and feeding the signal modulated with the wanted signal to the first input of the phase detector when the first switching device is switched to the first output signal.

In other words, the objects of the invention are achieved by the circuit configuration for modulation which comprises: a first modulator having a controllable-frequency oscillator which has one output for a first output signal; a phase detector in which the output of the oscillator is fed back via a down-conversion mixer to the phase detector, and a mixer arrangement in order to produce a signal which is modulated with a wanted signal; a second modulator which is connected on. the input side to the output of the oscillator and which comprises a mixer arrangement in order to produce a signal, which is modulated with the wanted signal, as a second output signal; a first switching device in order to switch between the first and the second output signal, and a second switching device in order to produce an unmodulated signal at one input connection of the phase detector when the first switching device is switched to the second output signal, and in order to produce the signal which is modulated with the wanted signal at the input connection of the phase detector when the first switching device is switched to the first output signal.

In the circuit arrangement according to the invention, a transmission PLL is still used for GMSK modulation, and the advantages obtained from this are retained. When 8-PSK modulation is required, the arrangement switches to a direct modulator. The VCO in the transmission PLL is used as the oscillator for the carrier frequency of the direct modulator. For this purpose, the quadrature component modulator in the transmission PLL is switched to be inactive. The arrangement according to the invention thus combines the principles of the transmission PLL and of direct modulation, with particularly complex or expensive components being used jointly.

Owing to the lower specific transmission power for 8-PSK modulation, the standardization envisages less stringent noise requirements for the transmission path. Corresponding to the transmission power, the signal-to-noise ratio at 10 MHz and 20 MHz from the transmission carrier is around 6 dB lower than for GMSK modulation. Filtering is required after the power amplifier for GMSK modulation, since the noise in the transmission band is convoluted into the receiver band by the nonlinear amplifier (noise conversion gain). When a linear amplifier is used for 8-PSK , this effect occurs only to a very weak extent. It is thus sufficient to provide a surface acoustic wave filter at the output of the direct modulator and upstream of the transmission amplifier, in order to avoid transmission into the reception channel. There is no longer any need for a duplex filter, which would be required if a direct modulator were to be used for GMSK modulation, in order to comply with the requirements of the GSM edge Standard for crosstalk attenuation for 8-PSK modulation. The GMSK path does not require any duplex filter, so that the speech time of the mobile phone is further improved.

The use of the VCO in the transmission PLL as a synthesizer for the direct modulator provides a low-noise input signal for the direct modulator. The high-speed-regulating synthesizer with the relatively broad loop filter ensures that load-pulling effects, which can occur in comparison to conventional channel synthesizers at a limit frequency, are avoided in the arrangement according to the invention.

For 8-PSK operation, the VCO in the transmission PLL is expediently operated in an economy mode, so that the available mobile radio speech time is increased further.

In accordance with an added feature of the invention, there are provided terminal connections receiving quadrature components of the wanted signal, a switching device connected to the terminal connections, and further connections for carrying a constant signal, and wherein:

the switching device is connected and configured such that the wanted signal can be supplied to the mixer device of the second modulator, and the second switching device is connected and configured such that the constant signal can be supplied to the second mixer device when the first switching device is switched to the second output signal; and the second switching device is connected and configured such that the wanted signal can be supplied to the mixer device of the first modulator when the first switching device is switched to the first output signal.

In accordance with an additional feature of the invention, there is provided a further oscillator, and the second switching device is connected and configured such that an input of the mixer device of the first modulator is coupled to the further oscillator, and an output of the mixer device of the first modulator is coupled to the first input of the phase detector when the first switching device is switched to the first output signal; and the first input of the phase detector is directly connected to the further oscillator, bypassing the mixer device of the first modulator, when the first switching device is switched to the second output signal.

In accordance with another feature of the invention, a nonlinear amplifier is connected between the oscillator and the first switching device for coupling the first output signal to the first switching device, and a linear amplifier is connected to couple the second output signal to the first switching device.

In accordance with a further feature of the invention, there is provided an amplifier that can be switched between a first operating mode with nonlinear amplifier operation and a second operating mode with linear amplifier operation, and a switch connected to selectively supply the first output signal or the second output signal to an input of the amplifier.

In accordance with again an added feature of the invention, a surface acoustic wave filter is connected downstream to an output of the mixer device of the second modulator.

In accordance with again an additional feature of the invention, the mixer device of the first modulator is connected to an input of the down-conversion mixer.

In accordance with again another feature of the invention, the oscillator has an operating mode with a high driver capability and an operating mode with a lower driver capability, and wherein the second operating mode is selected when the first switching device is switched to the second output signal.

In accordance with a concomitant feature of the invention, the wanted signal is supplied with quadrature components, and each of the modulators includes:

a phase element for splitting a carrier signal into signal components phase-shifted through 90° with respect to one another;

two mixers each receiving one of the signal components and one of the quadrature components; and an adder element connected to the two mixers for adding output signals from the two mixers.

Various alternative concepts may be used for switching between the transmission PLL and the direct modulator. The quadrature component modulator in the transmission PLL is expediently actuated with constant quadrature signal components during 8-PSK operation, so that, effectively, there is no modulation. The additional complexity for providing the circuit arrangement according to the invention then comprises a further integrated circuit, which contains the components of the direct modulation arrangement. This circuit is compatible with, and can be combined with, previous integrated circuits for the transmission PLL. It is possible to continue to use previous circuit architectures just by adding the integrated circuit for the direct modulator, in order to develop GMSK-compatible mobile telephones further for combined GMSK/8-PSK operation. Alternatively, the quadrature component modulator in the transmission PLL can be bypassed for 8-PSK operation. The modulator is expediently switched off in this case, thus saving power consumption. However, this concept requires the integrated circuit for the transmission PLL to be redesigned.

The output stage amplifiers for the transmission PLL operate in a known manner nonlinearly with a limiter characteristic, since the GMSK symbols have a constant envelope curve or amplitude. The transmission output stage for the direct modulator in 8-PSK operation requires an amplifier with a linear transmission characteristic, since the envelope curve of the 8-PSK symbols or their amplitude is variable, and is thus not constant. The transmission paths of the transmission PLL and the direct modulator can on the one hand be combined downstream from the transmission amplifiers, in which case a nonlinear amplifier stage can be provided for the transmission PLL, and a linear amplifier stage can be provided for the direct modulator. On the other hand, the transmission paths can be combined upstream of the power output stage, in which case the amplifier can be designed to have a switchable operating point, so that nonlinear and linear amplifier operation can be carried out by a single amplifier stage as a function of the respective modulation type.

The transmission architecture according to the invention makes it possible to provide a solution optimized in terms of power consumption and production costs both for GMSK operation and for 8-PSK operation. Compatibility can be ensured with previous integrated transmission PLL circuits. This results in effective double utilization of components. The system can be extended without any problems to dual-band mobile radios, which comply with both the GSM Standard and the PCN Standard.

Other features which are considered as characteristic for the invention are set forth in the appended claims.

Although the invention is illustrated and described herein as embodied in a modulation arrangement, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
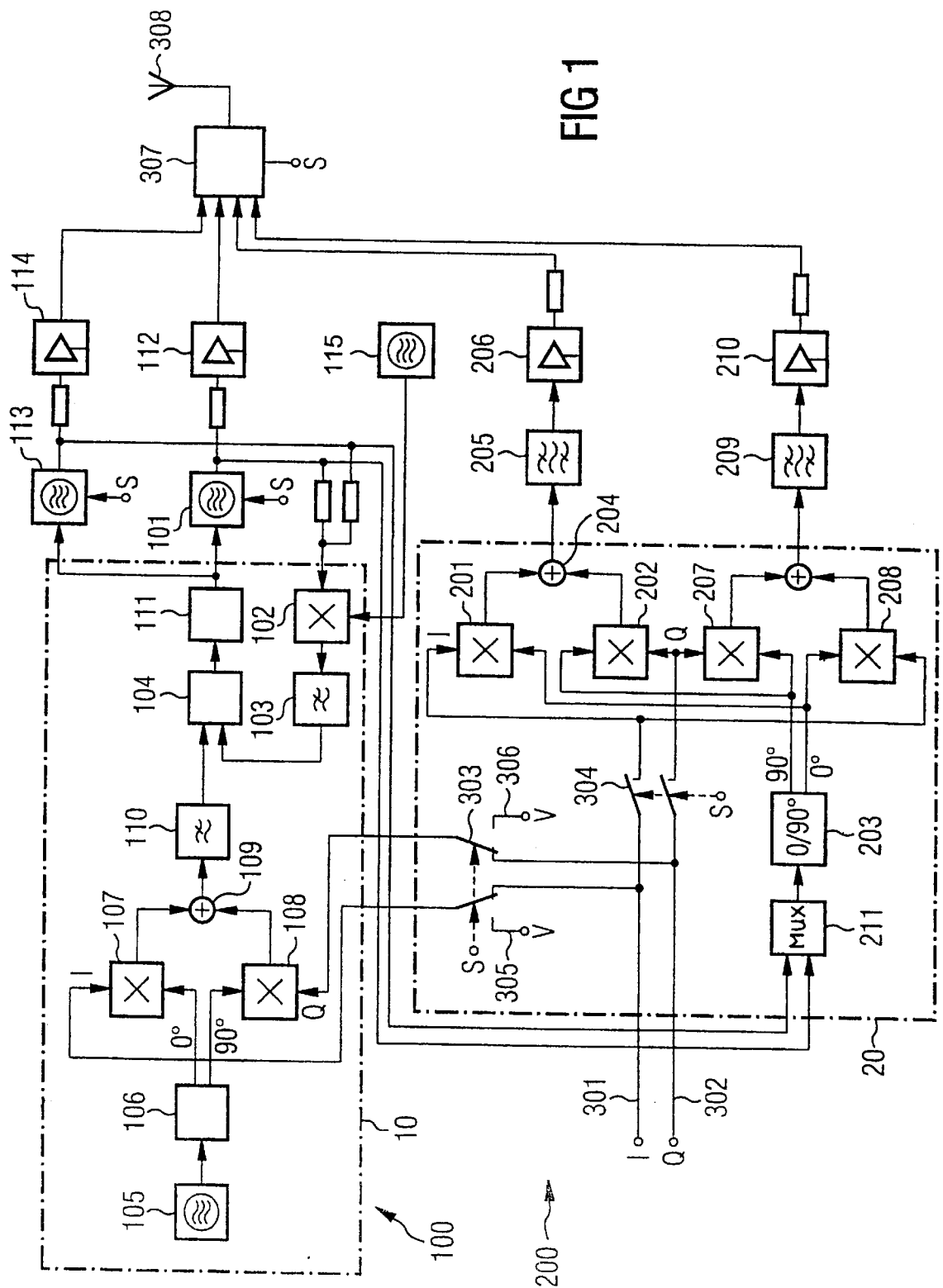
FIG. 1 is a schematic block diagram of a first exemplary embodiment of a circuit configuration for switchable GMSK/8-PSK modulation.

Referring now to the figures of the drawing in detail and first, particularly, to FIG. 1 thereof, there is seen a conventional transmission PLL (up-conversion loop) 100 and a direct modulation arrangement 200 using a common oscillator.

The transmission PLL 100 comprises a voltage-controlled oscillator (VCO) 101 whose output signal is GMSK-modulated for GMSK operation. The oscillator is fed back via a down-conversion mixer 102 with a downstream low-pass filter 103 to a phase detector or phase discriminator 104. The down-conversion mixer 102 is supplied with the frequency of the transmission channel produced by a further VCO 115, so that the output signal of the transmission VCO 101 can be tuned to different channels in the available GSM frequency band. The other input of the phase detector 104 is fed from an oscillator 105, whose output signal is first of all passed via a quadrature splitter 106, which produces quadrature components shifted through 0°/90°. These quadrature components are modulated with the quadrature components I, Q of a wanted signal in mixers 107 and 108, which are associated with the respective quadrature components. The modulated signals are added in an adder 109 and are passed on via a low-pass filter 110 to the reference input of the phase detector 104. The modulated signal which is present at this reference input of the phase detector 104 is compared with the transmission signal fed back via the path 102, . . . , 104. The phase difference is passed via a loop filter 111 and is fed as frequency control information into the transmission VCO 101. The loop filter 111 has a low-pass characteristic and passes the frequency band of the wanted signal, so that the phase of the VCO 101 is readjusted to correspond to the transmission signal I, Q. The GMSK-modulated transmission signal is then present at the output of the VCO 101.

For 8-PSK modulation, the direct modulator 200 has a quadrature component mixer 201, 202, to which the wanted signal components I, Q are supplied. Furthermore, the mixers 201, 202 are supplied with carrier signals that are phase-shifted through 90° with respect to one another. To do this, the carrier frequency is tapped off at the output of the VCO 101 of the transmission PLL, and is split into quadrature components in a phase shifter 203. An adder element 204 adds the modulated quadrature components to the outputs of the mixers 201, 202 to form the 8-PSK -modulated output signal of the direct modulator.

The quadrature components I, Q of the wanted signal are fed in at terminal connections 301, 302. A switch 303 connects the terminals 301, 302 to the signal inputs of the mixers 107, 108 of the transmission PLL during GMSK operation. A switch 304 is used to connect the connections 301, 302 to the wanted signal inputs of the mixers 201, 202 during 8-PSK operation. The switches 303, 304 are switched alternately. When the switch 304 is closed for 8-PSK operation, the switch 303 is rerouted to connections 305, 306, at which a constant signal V is fed in. This means that the signal inputs of the mixers 107, 108 have a constant signal applied to them, so that no wanted signal modulation takes place. To do this, the constant signal V must be chosen to be sufficiently large that the mixers 107, 108 operate as pure amplifiers. In this case, the VCO 101 of the transmission PLL produces an unmodulated carrier signal for the direct modulator 200.

A single line is illustrated for all the signals; it is self-evident that, in a practical implementation, certain signals, in particular the signal components I, Q, will be in the form of antiphase, differential signals and will be carried on appropriate lines.

In order to prevent undesirable sidebands produced by the direct modulator from being injected into the reception channel, a surface acoustic wave filter (SAW) 205 is connected to the output of the adder element 204. The surface acoustic wave filter acts as a bandpass filter with steep cut-off edges which suppresses signal components outside the transmission band with a high attenuation level. The SAW filter attenuation is sufficient to comply with the specifications in the Standard for 8-PSK operation. The transmission power for 8-PSK is 6 dB lower than that for GMSK, so that one SAW filter is sufficient. The SAW filter is relatively cost-effective, and nevertheless provides adequate attenuation.

The modulated output signal from the VCO 101 is amplified by a transmission amplifier 112. The amplifier 112 has a nonlinear characteristic and is used in the limiter mode, since the GMSK signal has a constant envelope curve. The SAW filter 205 is followed by a linear amplifier 206 as a transmission amplifier, so that the amplitude information, which varies in terms of symbols, of an 8-PSK signal is retained after amplification. The outputs of the two amplifiers 112, 206 are passed to a switch 307, which switches between GMSK or 8-PSK -modulated output signals, depending on the operating requirement. The transmission signal is transmitted via an antenna 308.

The described circuit is generally suitable for modulation which is switchable between GMSK and PSK, at any frequency. By means of appropriate parallel paths, the circuit can thus be developed both for the GSM 900 mobile radio standard and for the DCS 1800 or PCN mobile radio standard. The components described so far are designed for GSM 900. A VCO 113 with a downstream amplifier 114 is provided in parallel with the VCO 101 for the PCN frequency band. A quadrature component modulator 207, 208, and a corresponding SAW filter 209 and an associated amplifier 210 on the output side, are provided in parallel with the direct modulator 201, 202 for the PCN frequency band. The signal paths are joined together in the switch 307. A multiplexer 211 ensures switching between the VCOs 101 and 113 at the input of the phase shifter 203. The described circuit is suitable for production of a dual-band mobile radio with GSM edge capability.

In the circuit shown in FIG. 1, the elements surrounded by the frame 10 are combined in an integrated circuit. The VCOs on the transmission side together with the amplifiers and the VCO 115 for the channel frequencies are external to the chip. The integrated circuit 10 is available as a conventional component for a transmission PLL for GMSK modulation. The components of the direct modulator surrounded by the frame 20 can be produced in a further integrated circuit. In this case, the connections of the circuit 20 are compatible with those of the already known circuit 10. A GMSK-/8-PSK -compatible mobile radio can thus be developed using the previous circuit architecture for a mobile radio which is compatible only with GMSK, essentially by adding only the integrated circuit 20 and the components 205, 206, 209, 210 and 307.

Figure 2:
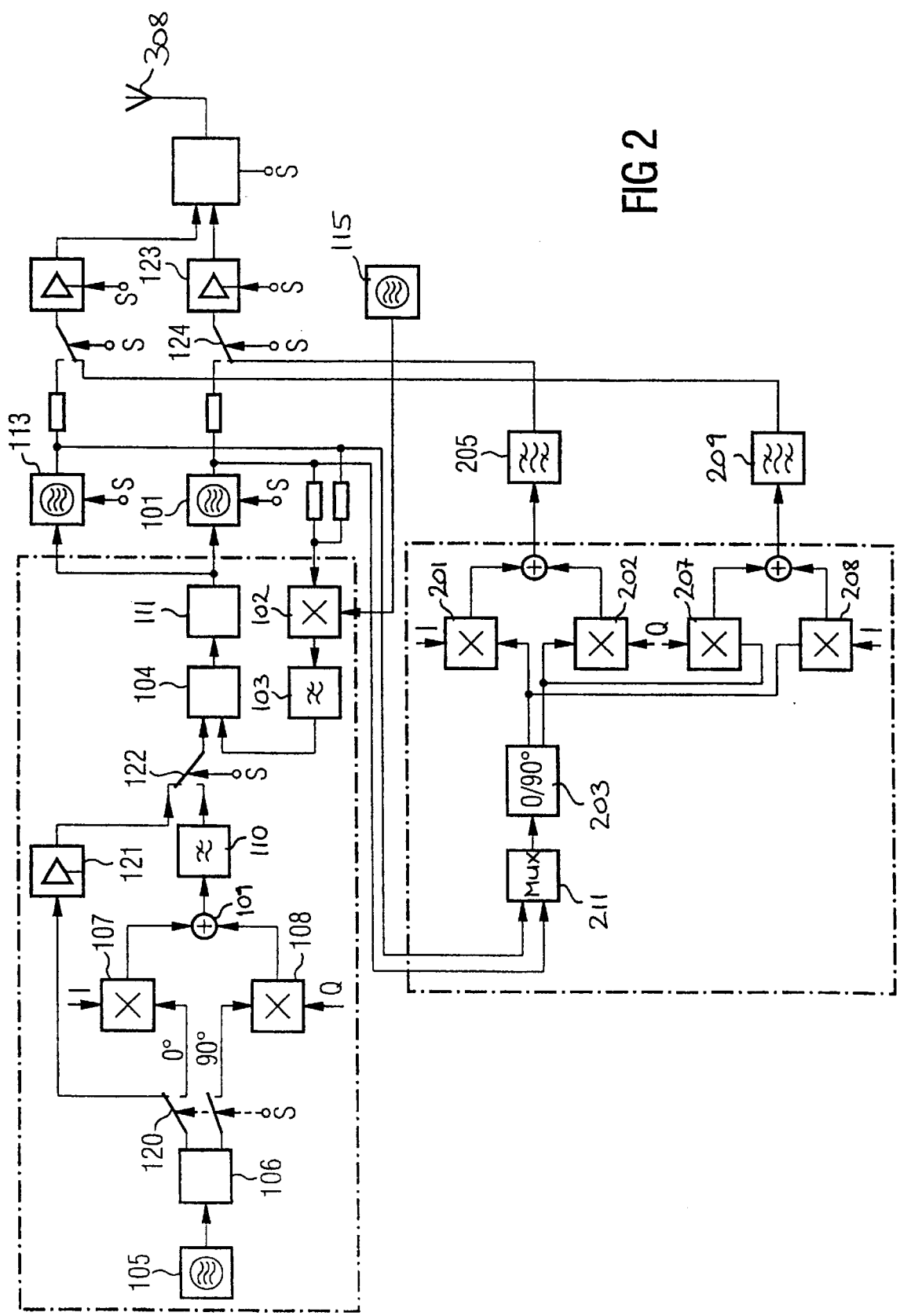
FIG. 2 is a similar view of a second exemplary embodiment of such a configuration.

In the embodiment shown in FIG. 2, the quadrature component modulator 107, 108 is bypassed for 8-PSK operation. This is done by providing a switch 120 at the output of the divider 106. The switch 120 passes on the carrier frequency (produced by the oscillator 105) to the modulator 107, 108 during GSM operation. For 8-PSK operation, on the other hand, it passes it via an amplifier 121. A switch 122 at the input of the phase discriminator 104 ensures that the signal path is switched as appropriate. This solution has the advantage that the mixers 107, 108 can be switched off during 8-PSK operation. This saves power losses, protects the batteries in the mobile radio, and lengthens the available speech time of the appliance. In comparison to the embodiment in FIG. 1, the switches 303, 304 are no longer required.

Instead of the output stage amplifiers provided for each signal path in FIG. 1, the circuit in FIG. 2 has combined power output stages for GMSK and 8-PSK operation (in each case separated for the GSM and PCN Standards). The amplifier 123 can be switched both for limiter operation during GMSK modulation and for linear amplifier operation during 8-PSK modulation, and is connected on the input side via a switch 124 both to the output of the VCO 101 and to the output of the SAW filter 205. The board layout, the wiring complexity and the line routing for the radio-frequency signals are simplified.

The driver capability and thus the power losses of the VCOs 101, 113 are expediently designed to be switchable. During GMSK operation, the VCOs 101, 113 are operated with a high power consumption in order to provide a signal with an appropriately adequate driver capability for the amplifiers 112 and 114, respectively. For 8-PSK operation it is sufficient to operate the VCOs 101, 113 with a low driver capability, and thus with a correspondingly lower power consumption, since the mixers 201, 202 and 207, 208, respectively, provide sufficient driver power for the associated output stages 206 and 210, respectively. The battery capacity and available transmission time for 8-PSK operation are thus in turn increased.

Switching between the GMSK and 8-PSK modulation types is controlled by a switching signal S. The signal S is supplied to the switches, to the amplifiers and to the oscillators, whose linearity responses and driver power are switchable.

Apart from this, and as an alternative to the illustrated embodiments, it is possible to arrange the quadrature component modulator 106, . . . , 110 for GMSK modulation in the transmission PLL feedback path. In this case, the phase element 106 may, possibly, be connected to the output of the filter 103 without any frequency division. The output of the filter 110 is fed back into the phase detector 104. The oscillator 105 is connected, possibly with a divider connected in between, directly, that is to say without a modulator, to the other connection of the phase detector 104.

The described circuit arrangement makes it possible to produce a mobile radio for multimedia applications in accordance with the GSM edge Standard at low cost. The advantages of using a transmission PLL (up-conversion loop) are retained. The additional complexity is kept low by double utilization of complex and costly components. Compatibility with previous architectures can be ensured by suitable configuration.

We claim:

1. A modulator circuit configuration, comprising:
    a first modulator having
        a controllable-frequency oscillator with an output for a first output signal;
        a down-conversion mixer connected to said output;
        a phase detector having a first input and a second input receiving the first output signal of said oscillator fed back via said down-conversion mixer; and
        a mixer device configured to produce a signal modulated with a wanted signal;
    a second modulator having
        an input connected to said output of said oscillator; and
        a mixer device configured to produce a signal, modulated with the wanted signal, as a second output signal;
    a first switching device connected to said first and second modulators for switching between the first output signal and the second output signal; and
    a second switching device connected to and feeding an unmodulated signal to said first input of said phase detector when said first switching device is switched to the second output signal, and feeding the signal modulated with the wanted signal to said first input of said phase detector when said first switching device is switched to the first. output signal.

2. The circuit configuration according to claim 1, which comprises terminal connections receiving quadrature components of the wanted signal, a switching device connected to said terminal connections, and further connections for carrying a constant signal, and wherein:
    said switching device is connected and configured such that the wanted signal can be supplied to said mixer device of said second modulator, and said second switching device is connected and configured such that the constant signal can be supplied to said second mixer device when said first switching device is switched to the second output signal; and
    said second switching device is connected and configured such that the wanted signal can be supplied to said mixer device of said first modulator when said first switching device is switched to the first output signal.

3. The circuit configuration according to claim 1, which comprises a further oscillator, and said second switching device is connected and configured such that an input of said mixer device of said first modulator is coupled to said further oscillator, and an output of said mixer device of said first modulator is coupled to said first input of said phase detector when said first switching device is switched to the first output signal; and said first input of said phase detector is directly connected to said further oscillator, bypassing said mixer device of said first modulator, when said first switching device is switched to the second output signal.

4. The circuit configuration according to claim 1, which comprises a nonlinear amplifier connected between said oscillator and said first switching device for coupling the first output signal to said first switching device, and a linear amplifier connected to couple the second output signal to said first switching device.

5. The circuit configuration according to claim 1, which comprises an amplifier configured to be switchable between a first operating mode with nonlinear amplifier operation and a second operating mode with linear amplifier operation, and a switch connected to selectively supply the first output signal or the second output signal to an input of said amplifier.

6. The circuit configuration according to claim 1, which comprises a surface acoustic wave filter connected an output of said mixer device of said second modulator.

7. The circuit configuration according to claim 1, wherein said mixer device of said first modulator is connected to an input of said down-conversion mixer.

8. The circuit configuration according to claim 1, wherein said oscillator has an operating mode with a high driver capability and an operating mode with a lower driver capability, and wherein the second operating mode is selected when the first switching device is switched to the second output signal.

9. The circuit configuration according to claim 1, wherein the wanted signal is supplied with quadrature components, and each of said modulators includes:

a phase element for splitting a carrier signal into signal components phase-shifted through 90° with respect to one another; two mixers each receiving one of the signal components and one of the quadrature components; and an adder element connected to said two mixers for adding output signals from said two mixers.

* * * * *